United States Patent [19]
Watanabe et al.

[11] Patent Number: 6,078,241
[45] Date of Patent: Jun. 20, 2000

[54] NOISE ABSORBER

[75] Inventors: Yuetsu Watanabe; Hiroyuki Uemura, both of Akita, Japan

[73] Assignee: TDK Corporation, Tokyo, Japan

[21] Appl. No.: 09/263,769

[22] Filed: Mar. 5, 1999

Related U.S. Application Data

[62] Division of application No. 09/041,039, Mar. 12, 1998, Pat. No. 5,920,250.

[30]    Foreign Application Priority Data

Mar. 14, 1997  [JP]  Japan ........................................ 9-61527
Feb. 18, 1998  [JP]  Japan ...................................... 10-36425

[51] Int. Cl.$^7$ ............................. H01F 17/06; H01F 27/02; H01F 27/26
[52] U.S. Cl. ............................. 336/92; 333/12; 336/176; 336/212
[58] Field of Search ..................................... 336/174, 175, 336/176, 92, 229, 210, 212, 90; 333/81 R, 12, 182, 183; 324/127; 174/92, 101, 72 A, 135; 361/732, 759

[56]             References Cited

U.S. PATENT DOCUMENTS 4,049,357   9/1977   Hamisch, Jr. ............................ 174/92
4,426,108   1/1984   Kesselman ............................... 174/92
4,873,505  10/1989   Matsui .................................. 336/176

FOREIGN PATENT DOCUMENTS 62-14770   4/1987   Japan .
2-91315    7/1990   Japan .
06-60117   8/1994   Japan .
6-32718    8/1994   Japan .

*Primary Examiner*—Thomas J. Kozma
*Attorney, Agent, or Firm*—Oblon, Spivak, McClelland, Maier & Neustadt, P.C.

[57]              ABSTRACT

A noise absorber capable of preventing a cable from becoming damaged with a high degree of reliability while demonstrating outstanding noise absorbing characteristics is provided with a cover 1 and a pair of ferrites 21 and 22. The cover 1 is constituted through the combination of a first cover 11 and a second cover 12. The first cover 11 is provided with a ferrite storage portion 110 and a cable storage portion 111. The second cover 12 is provided with a ferrite storage portion 120 and a cable storage portion 121. The ferrite storage portion 110 is formed at an internal surface of the first cover 11 and the ferrite storage portion 120 is formed at an internal surface of the second cover 12. The cable storage portion 111 is formed adjacent to the ferrite storage portion 110 at a side thereof, whereas the cable storage portion 121 is formed adjacent to the ferrite storage portion 120 at a side thereof. The pair of ferrites 21 and 22 are provided in the ferrite storage portions 110 and 120 at the first cover 11 and the second cover 12 respectively and are combined so as to form between them a cable passage constituted of indented grooves 211 and 222. The indented grooves 211 and 222 and the cable storage portions 111 and 121 constitute a continuous cable guide passage.

6 Claims, 12 Drawing Sheets

NOISE ABSORBER

This application is a division of application Ser. No. 07/041,039 filed on Mar. 12, 1998 now U.S. Pat. No. 5,920,250.

BACKGROUND OF THE INVENTION

1. Field of the Invention

The present invention relates to a noise absorber which is to be mounted at a cable of an electronic device such as a personal computer, a video game device or the like.

2. Discussion of Background

This type of noise absorber in the known art includes, for instance, that disclosed in Japanese Examined Utility Model Publication No. 32718/1994, in which a pair of ferrites that are combined in such a manner that a cable passage is formed between them, are enclosed with a cover.

The cable may be wound around this type of noise absorber once or twice by the user in order to improve the electrical characteristics. However, when it is used in this manner, the cable is exposed at the external circumferential portion of the cover and this exposed portion of the cable is likely to become damaged. As a means for preventing the exposed portion of the cable from becoming damaged, a method in which the exposed portion of the cable is covered with heat-shrink tube, which becomes thermally contracted onto the exposed portion to enclose and protect it, is adopted in the prior art.

However, if external connectors are mounted at the two ends of the cable, it is necessary to pass the external connectors through the heat-shrink tube in order to enclose the cover and the exposed portion of the cable with the heat-shrink tube. Thus, if the internal diameter of the heat-shrink tube is smaller than the external diameter of the external connectors, the heat-shrink tube cannot be mounted.

The problem discussed above can be avoided by setting the internal diameter of the heat-shrink tube larger than the external diameter of the external connectors. However, in that case, the internal diameter of the heat-shrink tube will become considerably larger than the external diameter of the exposed portion of the cable in the noise absorber, resulting in a gap formed between the contracted heat-shrink tube cover and the exposed portion of the cable. This presents a problem in that the heat-shrink tube will not fit the noise absorber tightly, which, in the worst case, will result in the heat-shrink tube coming off.

In addition, if the noise absorber described above is mounted at the cable of a computer used by a child, the noise absorber may be taken off the cable by the child, which will result in the noise absorption effect of the noise absorber being lost. At the same time, there are situations in which it is necessary to remove the mounted noise absorber from the cable.

SUMMARY OF THE INVENTION

It is an object of the present invention to provide a noise absorber that can be mounted at a cable easily and quickly.

It is a further object of the present invention to provide a noise absorber that has outstanding noise absorption characteristics.

It is a still further object of the present invention to provide a noise absorber that can prevent the cable from becoming damaged with a high degree of reliability.

It is a still further object of the present invention to provide a noise absorber that can not be removed from the cable through the actions of a child.

In order to achieve the objects described above, the noise absorber according to the present invention includes a cover and a pair of ferrites. The cover is constituted through the combination of a first cover and a second cover. The first cover and the second cover are each provided with a ferrite storage portion and a cable storage portion. The ferrite storage portions are formed at the internal surfaces of the first cover and the second cover. The cable storage portions are formed adjacent to the ferrite storage portions at one side of each ferrite storage portion. The pair of ferrites, which are positioned in the ferrite storage portions of the first cover and the second cover, are combined in such a manner that a cable passage is formed between them. The cable passage and the cable storage portions constitute a continuous cable guide passage.

As described above, the cover is constituted through the combination of the first cover and the second cover. The first cover and the second cover are both provided with a ferrite storage portion at their internal surfaces. The pair of ferrites, which are provided at the ferrite storage portions of the first cover and the second cover, are combined in such a manner that a cable passage is formed between them. With this structure, by positioning a cable at the cable passage at either the first cover side or the second cover side and sealing the first cover and the second cover jointly, the noise absorber can be mounted at the cable easily. Furthermore, no hindrance is presented even when the cable is already connected to an electronic device such as a personal computer or a video game device, even while connectors are connected.

The first cover includes the cable storage portion which is formed adjacent to the ferrite storage portion at a side thereof. The cable passage and the cable storage portion constitute a continuous cable guide passage. In this structure, the cable can be progressively introduced into the cable passage, the cable storage portion and the cable passage along the cable guide passage. In this case, unlike a structure in which the cable is simply made to pass through the ferrites, the cable passes through the cable passage at a length that corresponds to the number of times it is wound around. Thus, the noise absorption characteristics are improved.

Furthermore, since the cable storage portions are formed at the internal surfaces of the first cover and the second cover, the cable can be wound and stored inside the cover without becoming exposed at the external circumferential portion of the cover.

Another embodiment of the noise absorber according to the present invention includes a cover and a pair of ferrites. The cover is constituted through the combination of a first cover and a second cover. The first cover and the second cover are each provided with a ferrite storage portion. The ferrite storage portions are formed at the internal surfaces of the first cover and the second cover. The pair of ferrites, which are positioned at the ferrite storage portions of the first cover and the second cover, are combined in such a manner that a cable passage is formed between them. The first cover and the second cover are linked with hinges at their edges at one end, and a retaining mechanism is provided at the edge at the other end that faces opposite the edge at the one end. The retaining mechanism includes first holes and hooks. Within each of the first holes, a projecting piece that projects inward is provided. The hook is inserted within the first hole to be retained at the projecting piece. The first hole includes a narrow portion which is narrowed down by the projecting piece so that its hole diameter at the narrow portion is smaller than the external diameter of the portion where the hook is inserted. The projecting piece has a spring property.

The cover is constituted through the combination of the first cover and the second cover. The first cover and the second cover are provided with the ferrite storage portions which are formed at the internal surfaces of the first cover and the second cover. The pair of ferrites, which are provided at the ferrite storage portions of the first cover and the second cover, are combined in such a manner that a cable passage is formed between them. With this structure, by positioning a cable at the cable passage at either the first cover or the second cover and sealing the first cover and the second cover jointly, the noise absorber can be mounted at the cable easily. Furthermore, no hindrance is presented even when the cable is already connected to an electronic device such as a personal computer or a video game device, even when the connectors are connected.

In addition, the first cover and the second cover are connected to each other at their edges at one end via the hinges, and a retaining mechanism is provided at the edge at the other end that faces opposite the one end. Thus, when mounting the noise absorber described above at a cable, the first cover and the second cover can be connected to each other with ease by employing the hinges and the retaining mechanism.

Furthermore, the retaining mechanism includes first holes and hooks. Within each first hole, a projecting piece that projects inward is provided. The hook is inserted within the first hole to be retained at the projecting piece. The first hole includes a narrow portion which is narrowed down by the projecting piece so that its hole diameter at the narrow portion is smaller than the external diameter of the portion where the hook is inserted. The projecting piece has a spring property.

Thus, when the hook is inserted within the first hole of the retaining mechanism, the projecting piece is bent by taking advantage of its spring property even though the hole diameter at the narrow portion is smaller than the external diameter of the insertion portion of the hook, so that the insertion portion of the hook is pressed within the first hole to retain the hook at the projecting piece.

Since the projecting piece has a spring property, the projecting piece recovers its original shape after the hook is retained at the projecting piece. Once the projecting piece recovers its original shape, since the hole diameter of the first hole at the narrow portion is smaller than the external diameter of the insertion portion of the hook, the hook cannot be disengaged from the projecting piece or come out of the first hole. Thus, there is no likelihood of the hook becoming disengaged from the projecting piece through the actions of a child.

BRIEF DESCRIPTION OF THE DRAWINGS

These and other advantages, features and objects of the present invention will be understood by those of ordinary skill in the art referring to the annexed drawings, given purely by way of non-limitative example, in which.

DETAILED DESCRIPTION OF THE PREFERRED EMBODIMENTS

Figure 1:
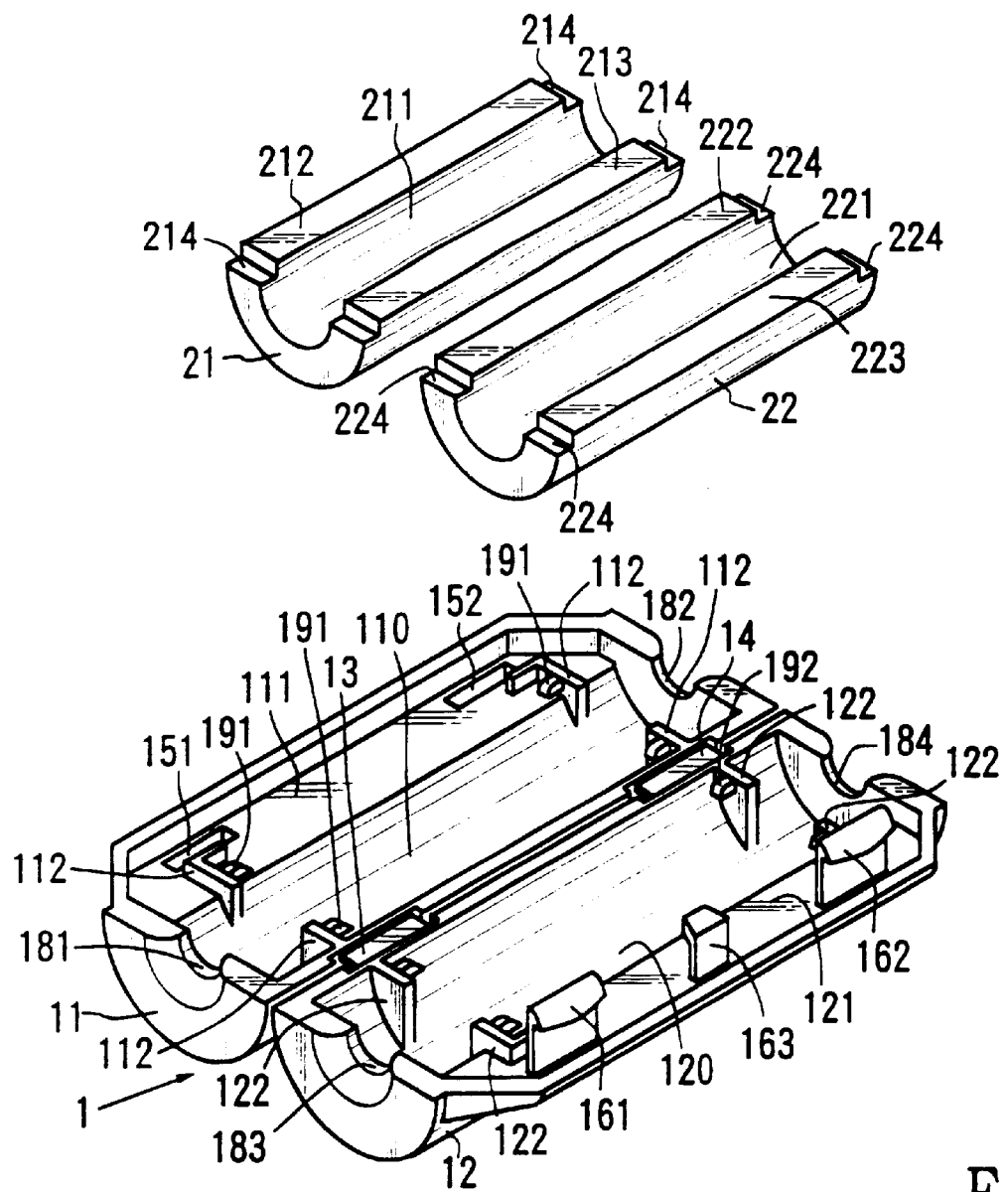
FIG. 1 is an exploded perspective of the noise absorber according to the present invention.
Figure 2:
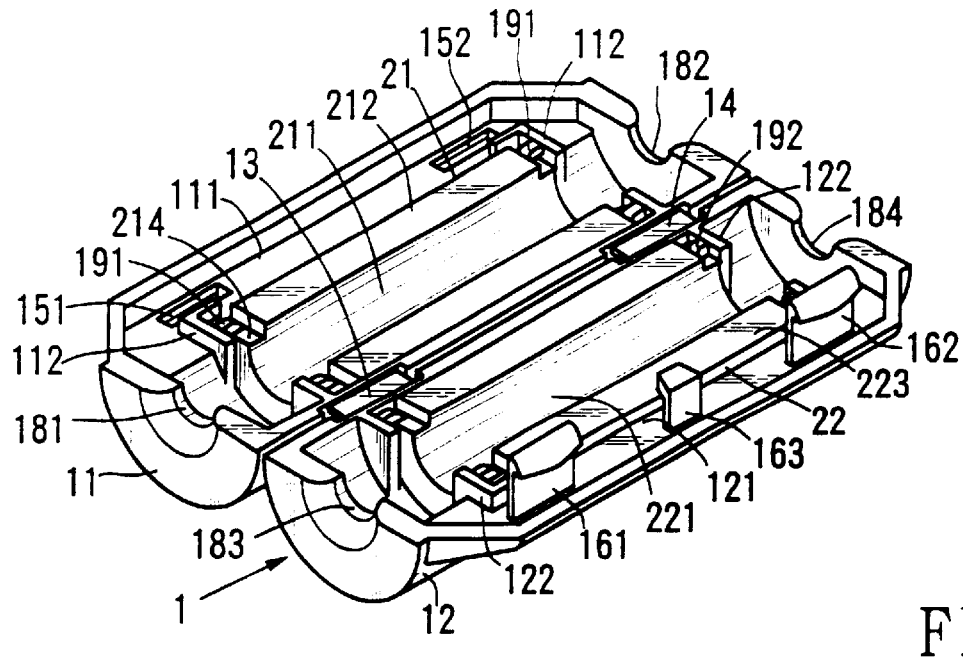
FIG. 2 is a perspective of the noise absorber shown in FIG. 1 in an assembled state.

Referring to FIGS. 1 to 4, the noise absorber according to the present invention includes a cover 1 and a pair of ferrites 21 and 22. The cover 1 is constituted through the combination of a first cover 11 and a second cover 12. It is desirable to constitute the first cover 11 and the second cover 12 from an elastic material such as plastic.

The first cover 11 is provided with a ferrite storage portion 110 and a cable storage portion 111. The ferrite storage portion 110, which is formed at the internal surface of the first cover 11, is provided with four receptacle portions 112 that receive the end portions of the ferrite 21 at its four corners. The receptacle portions 112 are formed projecting out. The cable storage portion 111 is formed adjacent to the ferrite storage portion 110 at a side thereof. In the figures, the cable storage portion 111 is formed to the outside of the receptacle portions 112 that function as cable guide portions.

The second cover 12, which is structured similar to the first cover 11, is provided with a ferrite storage portion 120 and a cable storage portion 121. The ferrite storage portion 120, which is formed at the internal surface of the second cover 12, is provided with four receptacle portions 122 that receive the end portions of the ferrite 22 at the four corners. The receptacle portions 122 are formed projecting out. The cable storage portion 121 is formed adjacent to the ferrite storage portion 120 at a side thereof. The cable storage portion 121 is formed to the outside of the receptacle portions 122 that function as cable guide portions. In the cable storage portion 121, a cable hold-down 163 with its front end formed in a hooked shape is provided. Thus, in this embodiment, the cable storage portion 121 provided at the second cover 12 essentially functions as a cable storage portion.

The first cover 11 and the second cover 12 are integrated with each other by hinge portions 13 and 14 that connect them together. The hinge portions 13 and 14, which constitute an integrated body with the first cover 11 and the second cover 12, provide flexibility achieved through selection of their thickness.

In the first cover 11, first holes 151 and 152 are provided at the side that faces opposite the side where the hinge portions 13 and 14 are provided. In the second cover 12, hooks 161 and 162 are provided at positions that correspond to the positions of the first holes 151 and 152 at the side facing opposite the side where the hinges 13 and 14 are provided. This retaining mechanism includes the first holes 151 and 152 and the hooks 161 and 162. The first holes 151 and 152 respectively include projecting pieces 153 and 154 that project inward. The hooks 161 and 162 are inserted within the first holes 151 and 152 respectively to be retained at the projecting pieces 153 and 154.

The first holes 151 and 152 respectively include narrow portions 155 and 156 which are narrowed down by the projecting pieces 153 and 154, with the hole diameter Dc at the narrow portions 155 and 156 being smaller than the external diameter Df at the front end portions of the hooks. The projecting pieces 153 and 154 are formed thin so that they take on a spring property.

Figure 3:
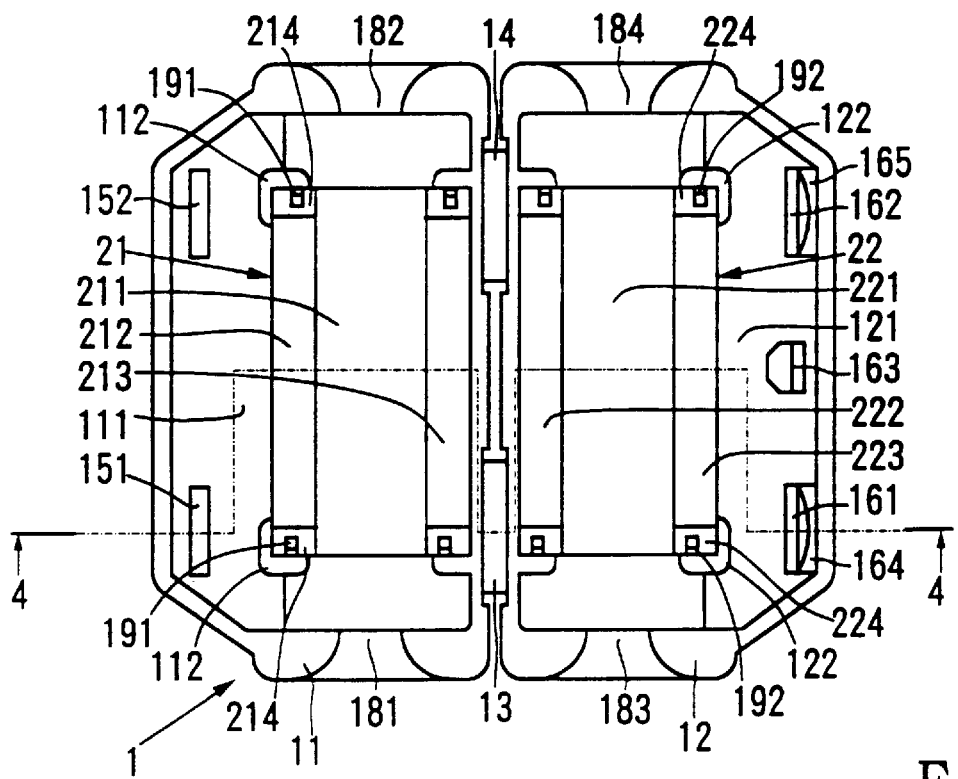
FIG. 3 is a plan view of the noise absorber shown in FIGS. 1 and 2.
Figure 4:
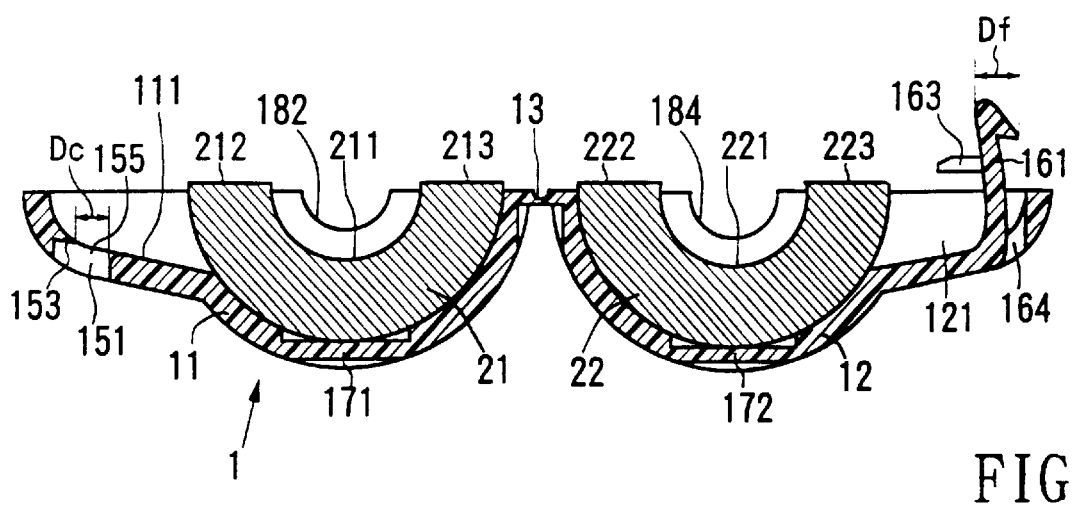
FIG. 4 is a cross section through line 4—4 in FIG. 3.

In addition, in the second cover 12, second holes 164 and 165 are provided at positions that correspond to the positions of the projecting pieces 153 and 154, at the side that faces opposite the side where the hinge portions 13 and 14 are provided (see FIG. 3 and the like). The second holes 164 and 165 pass through the second cover 12.

The retaining mechanism further includes the second holes 164 and 165. The second holes 164 and 165 are provided at positions that will face opposite the projecting pieces 153 and 154 when the hooks 161 and 162 are inserted within the first holes 151 and 152 to be retained at the projecting pieces 153 and 154.

Furthermore, the first cover 12 is provided with a cable hold-down 163 at the side that is opposite from the side where the hinge portions 13 and 14 are provided. In addition, the first cover 11 and the second cover 12 are respectively provided with spring pieces 171 and 172 at their bottoms (see FIG. 4). While the spring pieces 171 and 172 each extend from the center toward the two ends in the embodiment illustrated in FIGS. 1 to 4, they may be formed to extend from the two end portions toward the center.

The ferrite 21 is provided in the ferrite storage portion 110 of the first cover 11 while the ferrite 22 is provided in the ferrite storage portion 120 of the second cover 12. The ferrite 21 is formed in a split cylindrical shape, with an indented groove 211 provided at its center along the lengthwise direction and two sides of the indented groove 211 constituting contact surfaces 212 and 213 having a high degree of flatness. The internal circumferential surface of the indented groove 211 is formed in a semicircular shape, and four recessed portions 214 that drop down from the contact surfaces 212 and 213 are provided at the two ends in the axial direction.

Moreover, four claw pieces 191 project to the inside of the four receptacle portions 112 of the first cover 11, to be retained at the recessed portions 214 formed at the ferrite 21.

The ferrite 22, too, is formed in a split cylindrical shape, with an indented groove 221 provided at its center along the lengthwise direction and two sides of the indented groove 221 constituting contact surfaces 222 and 223 having a high degree of flatness. The internal circumferential surface of the indented groove 221 is formed in a semicircular shape, and four recessed portions 224 that drop down from the contact surfaces 222 and 223 are provided at the two ends in the axial direction.

In addition, four claw pieces 192 project to the inside of the four receptacle portions 122 of the first cover 12, to be retained at the recessed portions 224 formed at the ferrite 22.

While each of the four recessed portions 214 and 224 and the claw pieces 191 and 192 are provided at the first cover 11 and the second cover 12 respectively in this embodiment, they may be provided in larger quantity or smaller quantity. If they are to be provided in smaller quantity, it will be advantageous to effect the retention achieved by the recessed portions and the claw pieces at least at positions across corners in both the first cover 11 and the second cover 12. In addition, they may be provided at the two sides in the widthwise direction instead of at the two ends in the lengthwise direction.

The first cover 11 is provided with semicircular notches 181 and 182 at the two ends in its lengthwise direction, whereas the second cover 12 is provided with semicircular notches 183 and 184 at the two ends in its lengthwise direction. These semicircular notches 181 to 184 constitute opening portions that will lie continuous to the cable passage constituted by the indented grooves 211 and 221 when the first cover 11 and the second cover 12 are joined.

Figure 5:
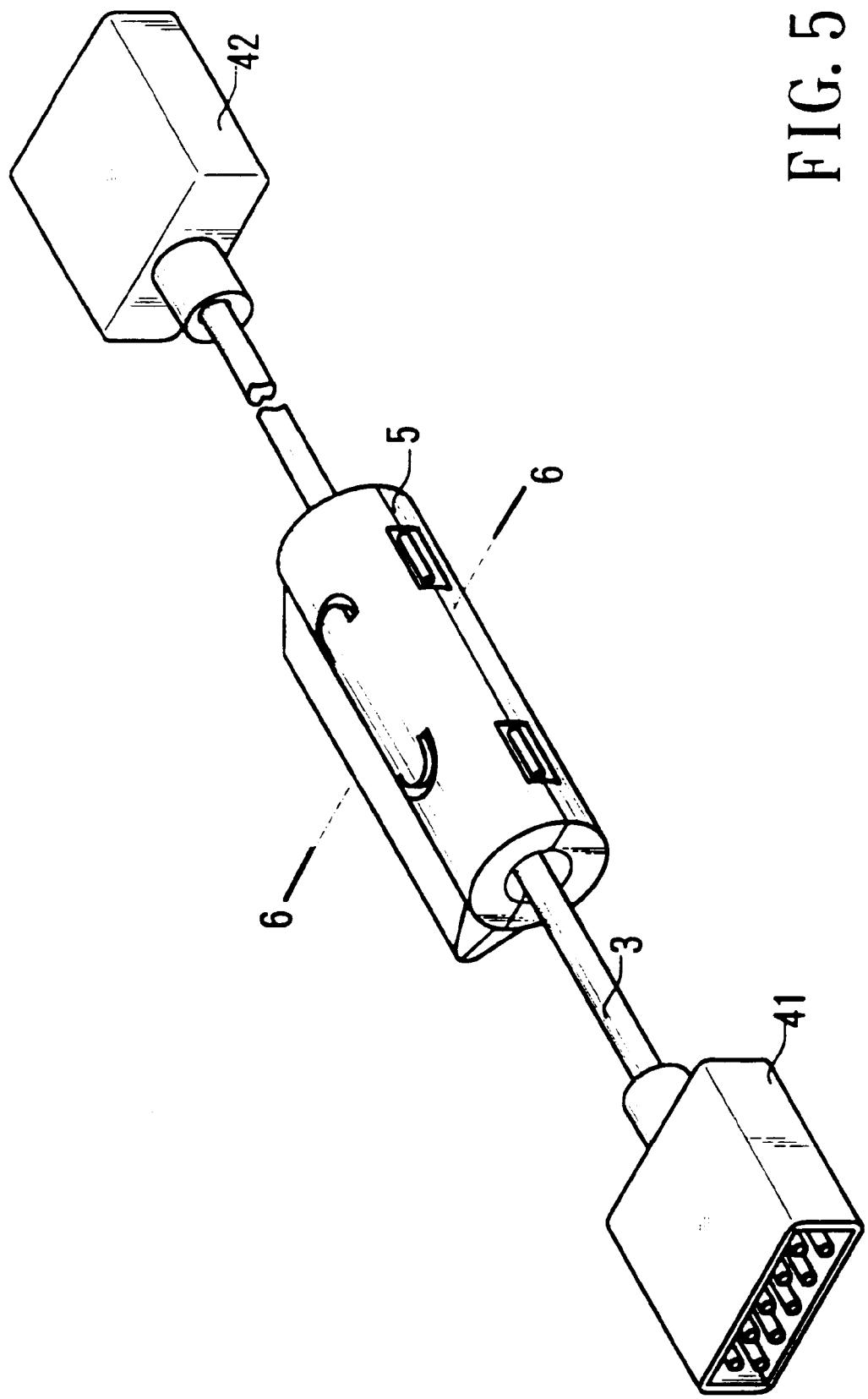
FIG. 5 is a perspective illustrating the operational state of the noise absorber according to the present invention.
Figure 6:
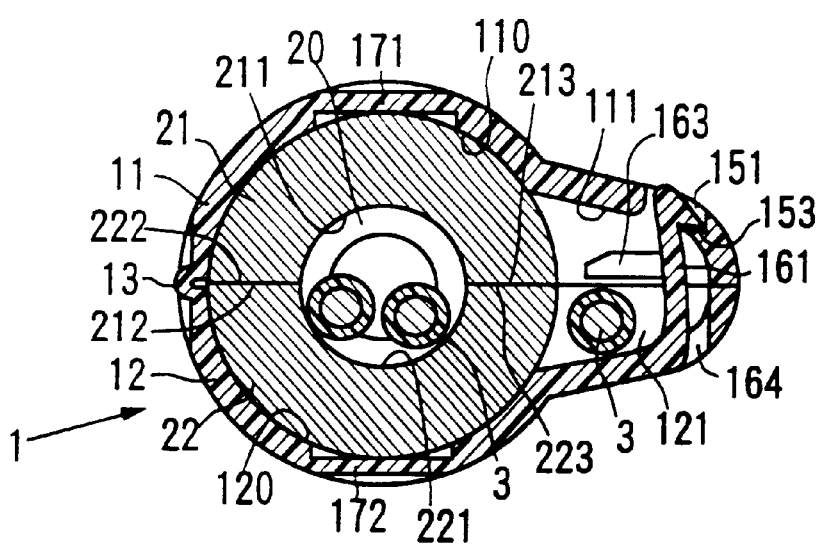
FIG. 6 is a cross section through line 6—6 in FIG. 5.
Figure 7:
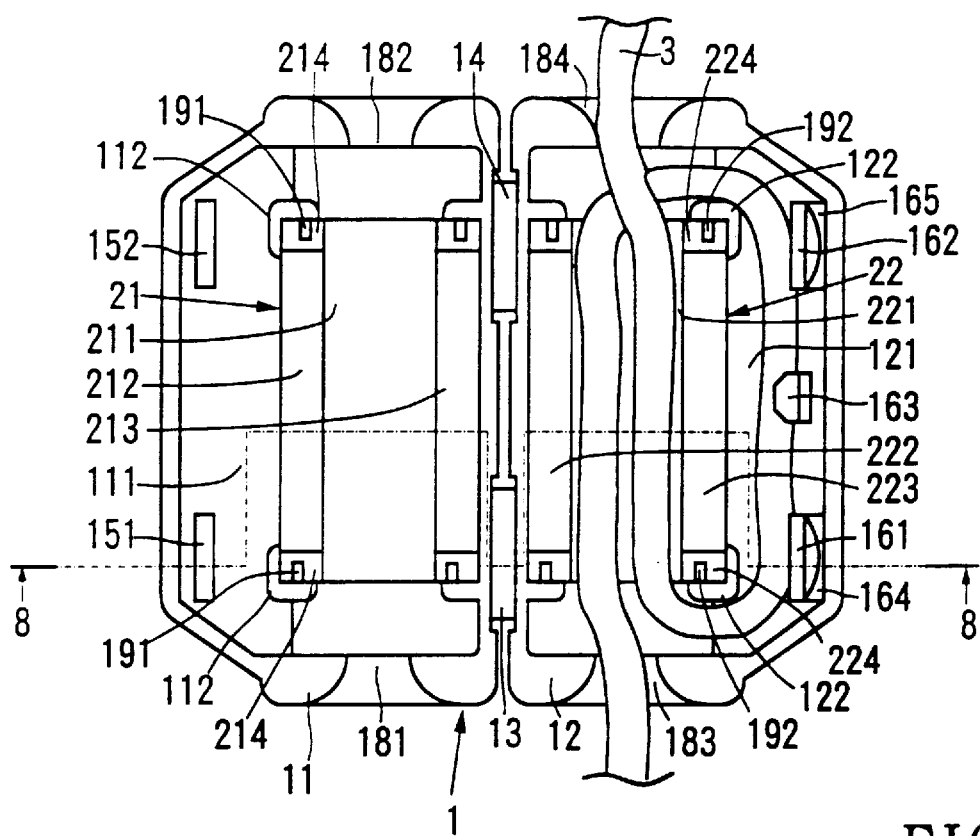
FIG. 7 is a plan view illustrating the noise absorber according to the present invention in an open state.
Figure 8:
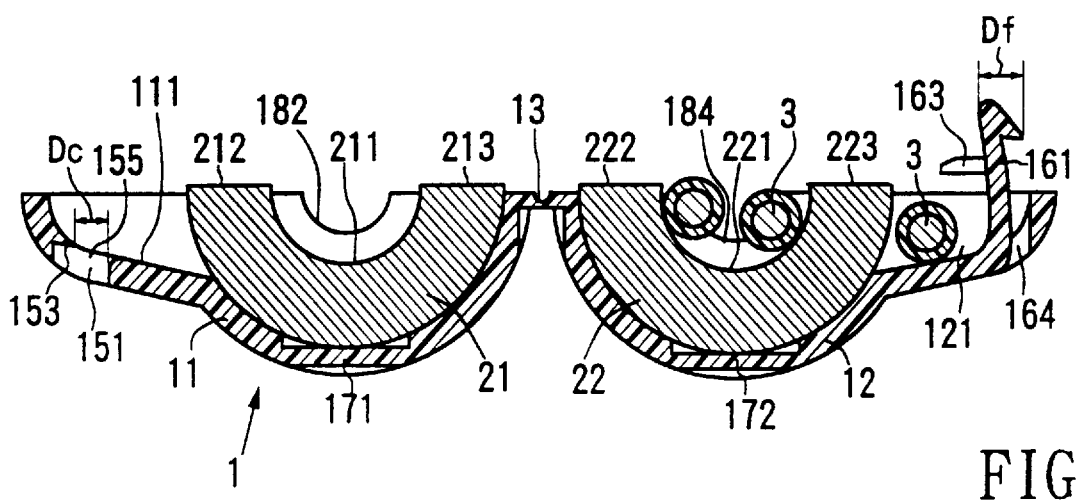
FIG. 8 is a cross section through line 8—8 in FIG. 7.

FIG. 5 is a perspective illustrating the operational state of the noise absorber according to the present invention, FIG. 6 is a cross section through line 6—6 in FIG. 5, FIG. 7 is a plan view illustrating an open state, and FIG. 8 is a cross section through line 8—8 in FIG. 7.

As illustrated in FIGS. 5 and 6, when mounting the noise absorber 5 according to the present invention at a cable 3 which is mounted with connectors 41 and 42 and the like, the cable 3 is progressively introduced into the cable passage 20 constituted of the indented groove 211 of the ferrite 21 and the indented groove 221 of the ferrite 22, through cable storage portion 121 of the second cover 12 and then into the cable passage 20 in a state in which the first cover 11 and the second cover 12 are open, as illustrated in FIG. 7. Then, the first cover 11 and the second cover 12 are connected to each other. As a result, even with the connectors 41 and 42 already mounted at the cable 3, the noise absorber 5 can be mounted at the cable 3 with ease. The mounting of the noise absorber 5 can be implemented equally easily when the connectors 41 and 42 are connected to an electronic device such as a personal computer, a game device or the like.

Furthermore, the cable 3 passes through the cable passage 20 at a length that is twice the length of cable passing through the ferrite (simple through-type). This means that the characteristics are improved to a level almost equal to the level achieved when four simple through-type noise absorbers are mounted to the cable.

Moreover, since the cable storage portion 121 is formed at the internal surface of the second cover 12, the cable 3 can be stored inside the cover 1 when it is wound without becoming exposed at the external circumferential portion of the cover 1. Thus, the cable 3 is reliably prevented from becoming damaged. While the cable 3 is wound through once in this embodiment, it may be wound through more than once by increasing the internal diameter of the cable passage 20 and increasing the space at the cable storage portions 111 and 121.

In addition, in this embodiment, the retaining mechanism that includes the first holes 151 and 152 and the hooks 161 and 162 is provided. The first holes 151 and 152 respectively include the projecting pieces 153 and 154 that project inward. In this retaining mechanism, the hooks 161 and 162 are inserted into the first holes 151 and 152 to be retained at the projecting pieces 153 and 154.

Figure 9:
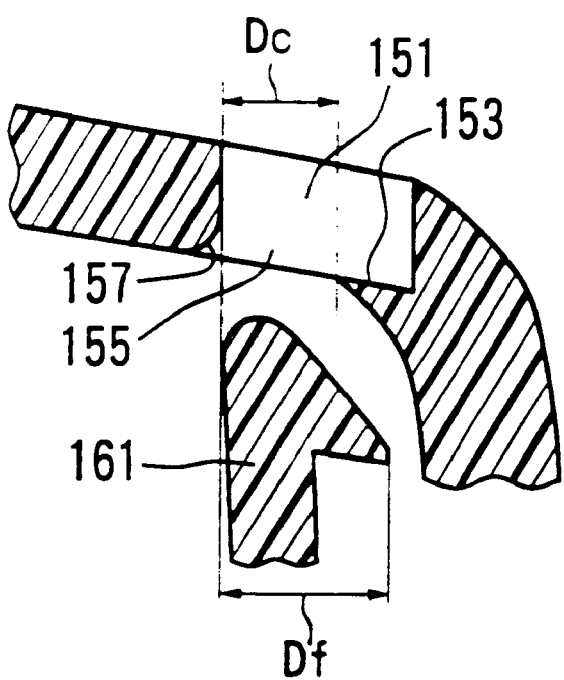
FIG. 9 is a cross section illustrating in an enlargement, the relationship between the first hole 151 in which the hook 161 is inserted and the hook 161.

FIG. 9 is a cross section which illustrates, in an enlargement, the relationship between the first hole 151 into which the hook 161 is inserted and the hook 161. Although not shown, the first hole 152 into which the hook 162 is inserted and the hook 162 have a similar relationship. The first holes 151 and 152 respectively include the narrow portions 155 and 156 which are narrowed down by the projecting pieces 153 and 154, with the hole diameter Dc at the narrow portions 155 and 156 being smaller than the external diameter Df at the front end portions of the hooks 161 and 162. The projecting pieces 153 and 154 have a spring property.

Figure 10:
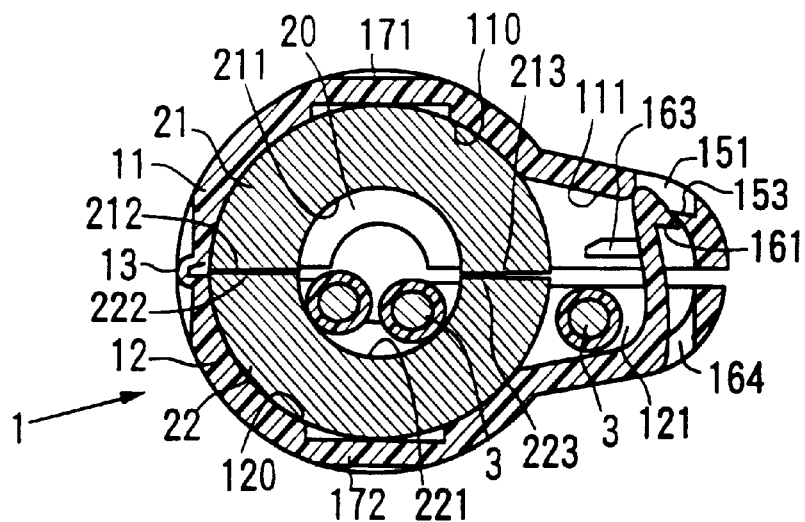
FIG. 10 is a cross section illustrating the retaining process for the noise absorber according to the present invention.
Figure 11:
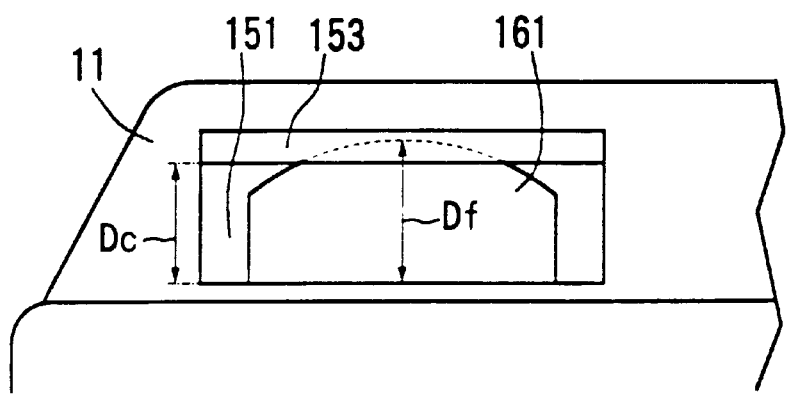
FIG. 11 illustrates the relationship between the hole and the hook in the state illustrated in FIG. 10.
Figure 12:
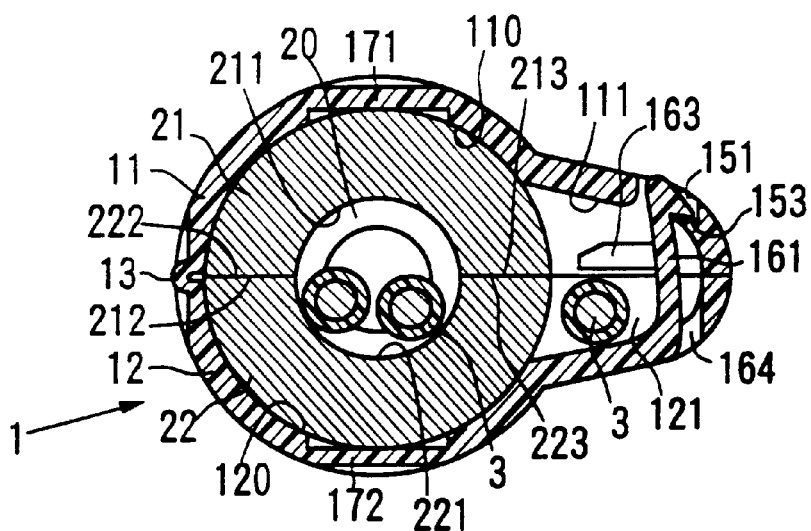
FIG. 12 is a cross section illustrating a state achieved after the noise absorber undergoes the retaining process illustrated in FIG. 10.
Figure 13:
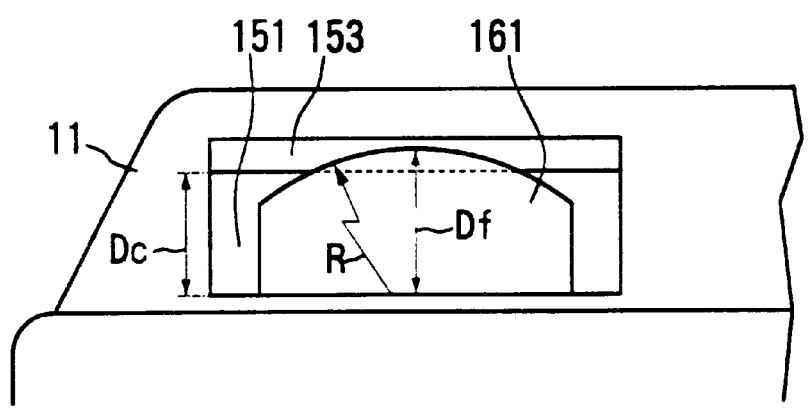
FIG. 13 illustrates the relationship between the hole and the hook in the retained state illustrated in FIG. 12.

Thus, as illustrated in FIGS. 10 and 11, when the hooks 161 and 162 are inserted into the first holes 151 and 152, the projecting pieces 153 and 154 are caused to bend by using the spring property of the projecting pieces 153 and 154 so that the insertion portions of the hooks 161 and 162 at their front ends are pressed into the first holes 151 and 152 although the hole diameter Dc of the narrow portions 155 and 156 is smaller than the external diameter Df of the hooks 161 and 162 to retain the hooks 161 and 162 at the projecting pieces 153 and 154, as illustrated in FIGS. 12 and 13.

Since the projecting pieces 153 and 154 have a spring property, the projecting pieces 153 and 154 recover their original shape after the hooks 161 and 162 are retained at the projecting pieces 153 and 154. Once the projecting pieces 153 and 154 recover their original shape, since the hole diameter Dc at the narrow portion 155 and 156 is smaller than the external diameter Df of the insertion portion of the hooks 161 and 162, the hooks 161 and 162 cannot be disengaged from the projecting pieces 153 and 154 or come out of the first holes 151 and 152. Thus, there is no likelihood of the hooks 161 and 162 becoming disengaged from the first holes 151 and 152 through child play or the like. Consequently, even when the noise absorber according to the present invention is mounted at a cable of a game device used by a child, there need be no concern about the noise absorber according to the present invention becoming disengaged from the cable due to the actions of the child.

It is desirable that end edges 157 and 158 of the insertion openings for the hooks 161 and 162 be formed in a rounded manner in the first holes 151 and 152 (see FIG. 9 and the like). With the end edges 157 and 158 of the insertion openings formed rounded, when the hooks 161 and 162 are inserted into the first holes 151 and 152, the hooks 161 and 162 never become caught at the end edges 157 and 158 so that they can be inserted smoothly. Alternatively, the end edges 157 and 158 at the insertion openings may be beveled to achieve similar advantages.

The end edges of the hooks 161 and 162 should be formed as curved end edges having a radius R (see FIG. 13 and the like). Since the resistance that the hooks 161 and 162 are subject to when they are pressed into the first holes 151 and 152 is greatly reduced with their end edges formed as curves compared to the resistance they would be subject to if they were formed straight, the hooking work is facilitated. Furthermore. since the extreme end portions at the curved end edges are retained at the projecting pieces 153 and 154 with a high degree of reliability, the hooks 161 and 162 will never slip out of the first holes 151 and 152 respectively.

In this embodiment, the retaining mechanism further includes the second holes 164 and 165. The second holes 164 and 165 are provided at positions that face opposite the projecting pieces 153 and 154 when the hooks 161 and 162 are inserted in the first holes 151 and 152 to be retained at the projecting pieces 153 and 154. The advantage of providing the second holes 164 and 165 is realized when removing the noise absorber from the cable 3.

Now the removal of the noise absorber from the cable 3 is explained. For this removal work, a removing tool 6 is used. The removing tool 6 may be, for instance, a blade-type screwdriver.

Before starting this removing work, the noise absorber is mounted on the cable 3, with the hooks 161 and 162 inserted in the first holes 151 and 152 and retained at the projecting pieces 153 and 154 as illustrated in FIGS. 12 and 13.

Figure 14:
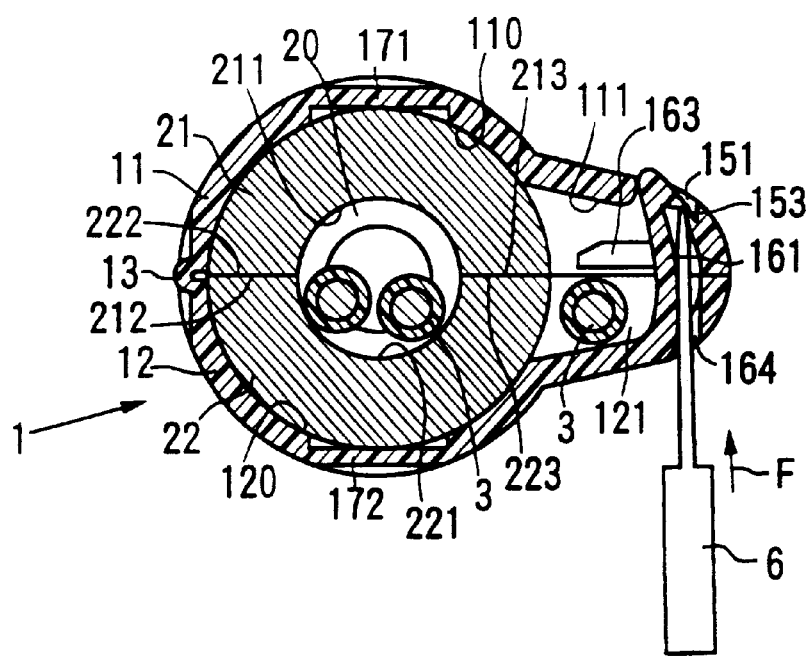
FIG. 14 is a cross section illustrating the process of removing the noise absorber according to the present invention.
Figure 15:
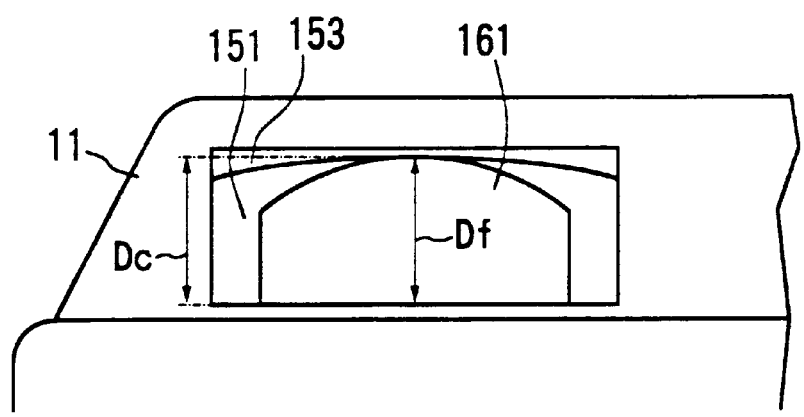
FIG. 15 illustrates the relationship between the hole and the hook in the state illustrated in FIG. 14.

The front end portion of the removing tool 6 is inserted into the second holes 164 and 165. The projecting pieces 153 and 154 at the first holes 151 and 152 have a spring property. Because of this, as illustrated in FIGS. 14 and 15, the projecting pieces 153 and 154 can be flexed in the direction in which they become disengaged from the hooks 161 and 162 by applying a force F to the projecting pieces 153 and 154 with the removing tool 6 to increase the hole diameter Dc at the narrow portions 155 and 156 until it becomes equal to the external diameter Df of the hooks 161 and 162. By using the removing tool 6 in this manner, the hooks 161 and 162 are disengaged from the projecting pieces 153 and 154 to restore the noise absorber to the state illustrated in FIGS. 10 and 11. Then, as illustrated in FIG. 7, the first cover 11 and the second cover 12 are opened to take out the cable 3 from the cable passage 20 constituted of the indented groove 211 and the indented groove 221 and also from the cable storage portion 121 at the second cover 12.

As has been explained, the noise absorber according to the present invention can be forcibly removed from the cable 3 by using the removing tool 6. Moreover, as explained earlier, there is no likelihood of the noise absorber according to the present invention being removed from the cable through child play or the like.

Furthermore, even with the connectors 41 and 42 mounted at the cable 3, the noise absorber according to the present invention can be forcibly removed from the cable 3 by using the removing tool 6 in a similar manner. The removal of the noise absorber is not hindered when the connectors 41 and 42 are connected to an electronic device such as a personal computer, a game device or the like.

The noise absorber according to the present invention does not require that the cable storage portions and the retaining mechanism be provided together. It only requires either of them.

Moreover, in this embodiment, the cable hold-down 163 is provided at the cable storage portion 121 of the second cover 12. The front end of the cable hold-down 163 is formed in a hooked shape. This structure ensures that the cable 3 does not become lifted off from the cable storage portion 121 when the noise absorber 5 is mounted on the cable 3. Thus, the winding of the cable 3 is facilitated.

The first cover 11 is provided with the spring piece 171 at its bottom and the second cover 12 is provided with the spring piece 172 at its bottom. When the cable 3 is positioned in the indented groove 211 of the ferrite 21 or the indented groove 221 of the ferrite 22 and the first cover 11 and the second cover 12 are caused to rotate relative to each other using the hinge portions 13 and 14 as the fulcrum to retain the hooks 161 and 162 at the first holes 151 and 152, this structure allows the contact surfaces (212, 213) and (222, 223) of the pair of ferrites 21 and 22 to come in full contact with each other due to the resilience of the spring pieces 171 and 172, to essentially form a magnetically shielded passage to reduce the magnetic resistance in the magnetic passage extending along the ferrites 21, 22, thereby achieving outstanding noise absorbing effect.

At the inside of a side surface of the first cover 11, the claw pieces 191 that are to be hooked at the recessed portions 214 formed at the ferrite 21 are projected. At the inside of a side surface of the second cover 12, too, claw pieces 192 that are to be hooked at the recessed portions 224 formed at the ferrite 22 are projected. With this structure, when the ferrite 21 is inserted into the first cover 11 and the ferrite 22 is inserted inside the second cover 12, the claw pieces 191 and 192 become bent due to their resilience and flexibility so that the ferrite 21 is guided inside the first cover 11 and the ferrite 22 is guided inside the second cover 12. Then, when the ferrite 21 is completely inserted in the first cover 11, the claw pieces 191 and 192 regain their original shape due to their resilience to be hooked at the recessed portions 214 and 224. When the ferrite 22 is completely inserted in the second cover 12, the claw pieces 191 and 192 regain their original shape due to their resilience to be hooked at the recessed portions 214 and 224. Thus, since the ferrites 21 and 22 are pressed from the side where the contact surfaces that constitute the upper surfaces are present, they are prevented from rotating or rocking and from falling out.

Figure 16:
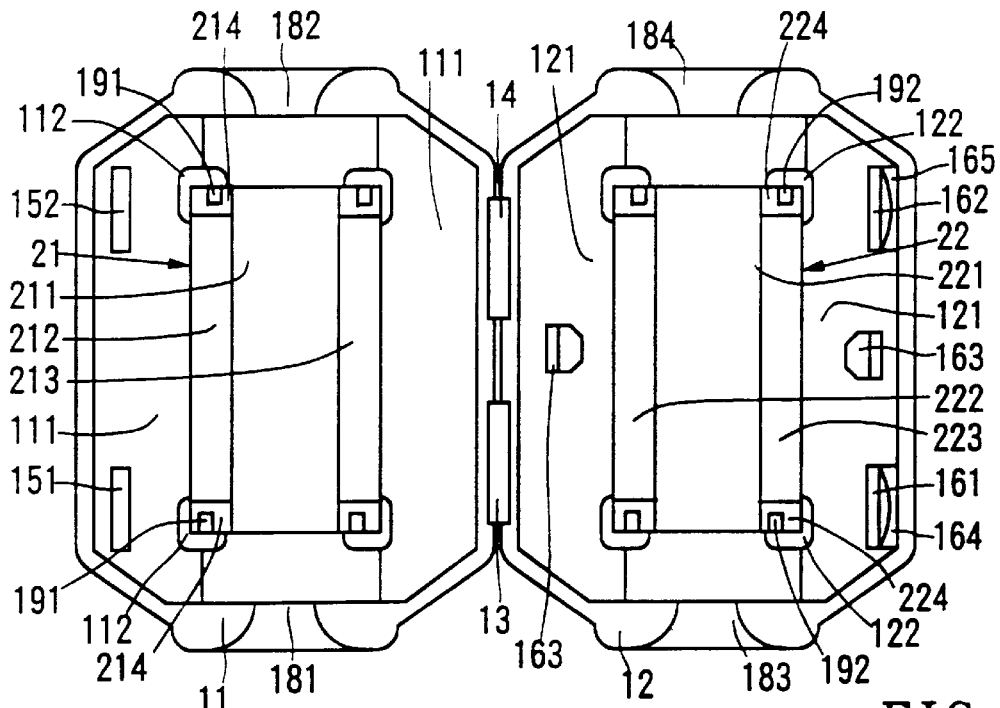
FIG. 16 is a plan view illustrating another embodiment of the noise absorber according to the present invention.

FIG. 16 is a plan view illustrating another embodiment of the noise absorber according to the present invention. In the figure, the same reference numbers are assigned to components that are identical to those shown in FIGS. 1 to 13 and their explanation is omitted. In this embodiment, two cable storage portions are provided at each of the first cover 11 and the second cover 12. Namely, in the first cover 11, two cable storage portions 111 and 111 are provided at the two sides of the ferrite storage portion 110, whereas in the second cover 12, two cable storage portions 121 and 121 are provided at the two sides of the ferrite storage portion 120. One cable hold-down 163 is provided at each of the cable storage portions 121 and 121.

Figure 17:
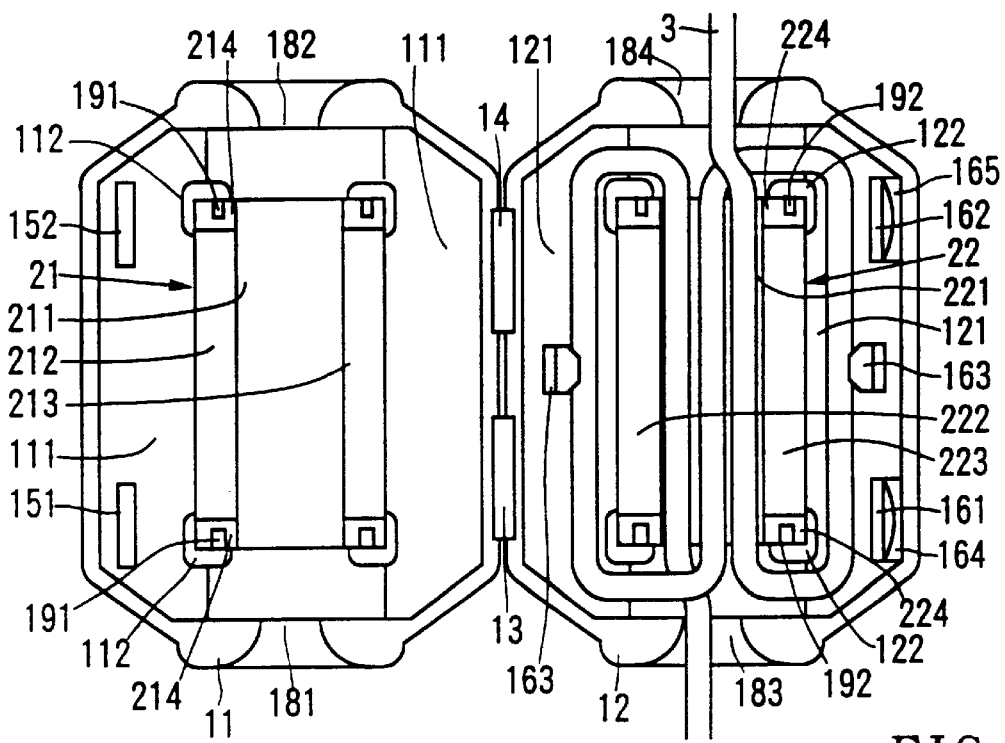
FIG. 17 is a plan view illustrating the operating state of the noise absorber in FIG. 16.

Through the structure illustrated in FIG. 16, in which the number of turns of the cable 3 can be increased as illustrated in FIG. 17, even more outstanding noise absorbing characteristics can be achieved.

Figure 18:
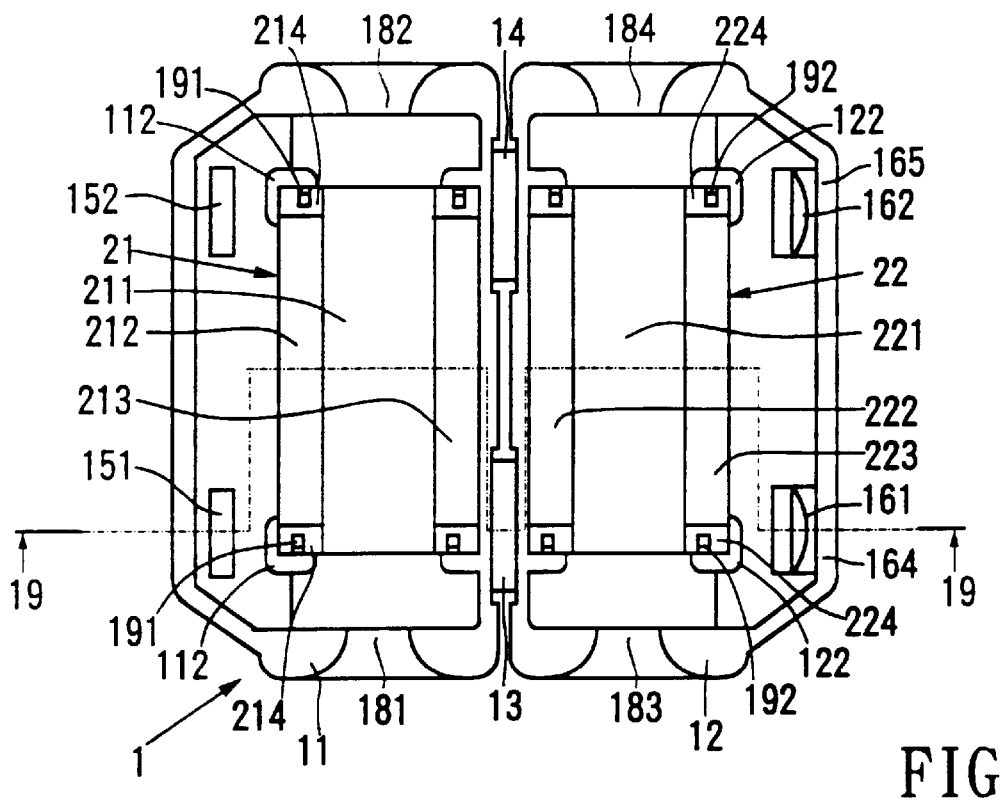
FIG. 18 is a plan view illustrating yet another embodiment of a noise absorber according to the present invention.
Figure 19:
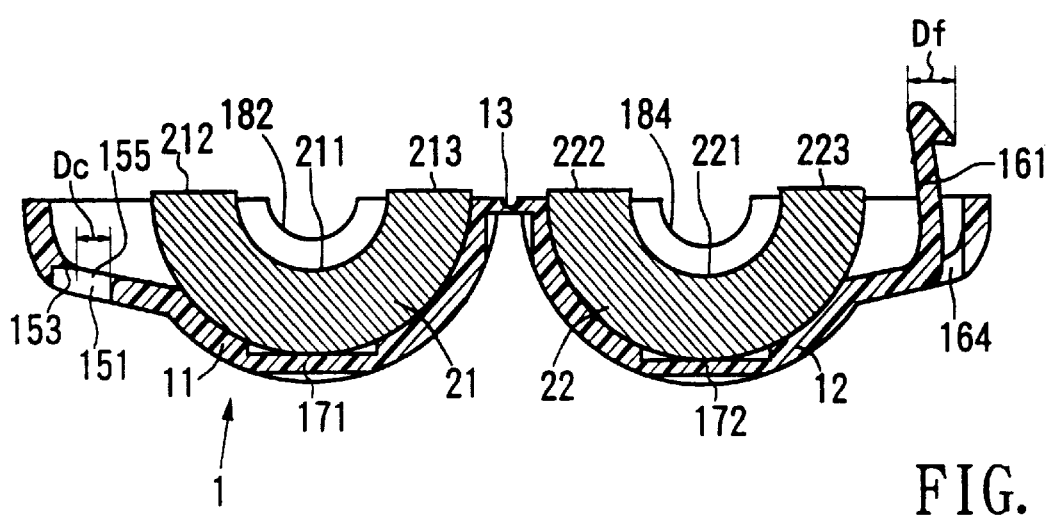
FIG. 19 is a cross section through line 19—19 in FIG. 18.

FIG. 18 is a plan view illustrating yet another embodiment of a noise absorber according to the present invention and FIG. 19 is a cross section through line 19—19 in FIG. 18. In these figures, the same reference numbers are assigned to components that are identical to those in FIGS. 1 to 15 and their explanation is omitted. The embodiment shown in FIGS. 18 and 19 is not provided with a cable storage portion but a retaining mechanism so that the same advantages as in the embodiments shown in FIGS. 1 to 15 can be achieved.

What is claimed is:

1. A noise absorber comprising:
   a cover constituted through the combination of a first cover and a second cover each having a ferrite storage portion at an internal surface thereof;
   a pair of ferrites provided at said ferrite storage portions, configured to form a cable passage when said first and second covers are engaged with each other; and
   a retaining mechanism including a first hole and a hook, wherein:
   said first cover and said second cover are connected with each other at first edges thereof by a hinge;
   said retaining mechanism is provided at second edges opposite said first edges;
   said first hole includes a projecting piece projecting within said first hole;
   said hook is configured to be retained at said projecting piece when said hook is inserted into said first hole; and
   said first hole is provided with a narrow portion which is narrowed by said projecting piece, a hole diameter at said narrow portion being set smaller than the external diameter of an insertion portion of said hook.

2. The noise absorber of claim 1, wherein:
   said projecting piece has a spring property.

3. The noise absorber of claim 1, wherein:
   said retaining mechanism further includes a second hole which is provided at a position that will face opposite said projecting piece when said hook is inserted within said first hole and is retained at said projecting piece.

4. The noise absorber of claim 1, wherein:
   said insertion portion of said hook is configured to be retained within said wide portion of said first hole.

5. The noise absorber of claim 1, wherein:
   said insertion portion has a terminal end with a rounded edge configured to facilitate insertion of the insertion portion within said first hole.

6. A noise absorber comprising:
   a cover constituted through the combination of a first cover and a second cover each having a ferrite storage portion at an internal surface thereof;
   a pair of ferrites provided at said ferrite storage portions, configured to form a cable passage when said first and second covers are engaged with each other; and
   a retaining mechanism including a first hole and a hook, wherein:
   said first cover and said second cover are connected with each other at first edges thereof by a hinge;
   said retaining mechanism is provided at second edges opposite said first edges;
   said first hole includes a projecting piece projecting within said first hole;
   said hook is configured to be retained at said projecting piece when said hook is inserted into said first hole; and
   said first hole is provided with a recessed wide portion and with a narrow portion which is narrowed by said projecting piece, a hole diameter at said narrow portion being set smaller than the external diameter of an insertion portion of said hook.

* * * * *